United States Patent
Glance

(10) Patent No.: US 6,363,093 B1
(45) Date of Patent: Mar. 26, 2002

(54) METHOD AND APPARATUS FOR A SINGLE-FREQUENCY LASER

(75) Inventor: Bernard Glance, Colts Neck, NJ (US)

(73) Assignee: AT&T Corp., New York, NY (US)

( * ) Notice: Subject to any disclaimer, the term of this patent is extended or adjusted under 35 U.S.C. 154(b) by 0 days.

(21) Appl. No.: 09/289,417

(22) Filed: Apr. 9, 1999

Related U.S. Application Data

(60) Provisional application No. 60/114,352, filed on Dec. 29, 1998.

(51) Int. Cl.[7] .............................. H01S 5/00; H01S 3/08
(52) U.S. Cl. ........................................... 372/50; 372/92
(58) Field of Search .............................. 372/50, 92, 49; 359/110

(56) References Cited

U.S. PATENT DOCUMENTS 4,726,030 A * 2/1988 Fye .............................. 372/50
5,537,238 A * 7/1996 Janniello et al. ............ 359/110

OTHER PUBLICATIONS

H.A. Macleod, *Thin–Film Optical Filters*, New York: American Elsevier Publishing Co. 1969, pp. 1–7, 154–199. (no month available).

* cited by examiner

Primary Examiner—Quyen Leung
(74) Attorney, Agent, or Firm—Kenyon & Kenyon

(57) ABSTRACT

The present invention provides for a method and an apparatus for a single-frequency laser. The laser is in a Fabry-Perot configuration. An approximately V-shaped groove is etched through a top cladding layer, an active layer and, at least partially, a bottom cladding layer. A Fabry-Perot filter is deposited on top of the approximately V-shaped groove. A regrowth region is grown, at least in part, on top of the Fabry-Perot filter. The slope of the V-shaped Fabry-Perot filter and the thickness of the layers of the Fabry-Perot filter determine which mode of the Fabry-Perot configuration is transmitted through the Fabry-Perot filter and permitted to lase.

30 Claims, 4 Drawing Sheets

METHOD AND APPARATUS FOR A SINGLE-FREQUENCY LASER

PRIORITY CLAIM

We hereby claim the benefit under 35 U.S.C. §119(e) of U.S. Provisional Application No. 60/114,352 filed Dec. 29, 1998, entitled "A Method and Apparatus for a Single-Frequency Laser."

FIELD OF THE INVENTION

The invention generally relates to the field of optical communications, and more specifically to optoelectronic devices.

BACKGROUND OF INVENTION

Lasers have become integral components in science and engineering. Lasers convert a sufficient external source of energy into coherent light inside a resonant cavity through, inter alia, the use of optical feedback.

A relatively simple laser 100 may be built using a Fabry-Perot configuration as illustrated in FIG. 1. FIG. 1 illustrates a perspective view of a simplified compound semiconductor heterostructure. An active region 104 is sandwiched between cladding layers 106. The cladding layers 106 are further characterized in that they are oppositely doped. The cleaved facets 110 of the laser 100 provide optical feedback by acting as partially reflecting mirrors. The facets 110 also provide exits for the light. The cladding layers 106 are typically coupled to an external electrical source such as a voltage or current source. Some definite advantages of the Fabry-Perot configuration include that it is easy and relatively cheap to fabricate. However, one large drawback in the Fabry-Perot configuration is that it accentuates a number of modes as determined by the geometry of the laser 100. Thus, the spectral output from the Fabry-Perot configuration reveals that a substantial number of wavelengths may be significantly amplified when a sufficient voltage or current source is applied.

The development of the distributed feedback (DFB) laser created devices that predominantly lase in one mode. FIG. 2 illustrates a side view of a simplified DFB semiconductor laser 200. Similar to the previous structure 100, the DFB laser 200 has an active region 204 sandwiched between cladding layers 208 and 210 which are typically oppositely doped. However, one of the differences from the previous structure 100 is that the DFB laser 200 has an etched grating 212 which extends the length of the cladding layer 208. The periodic perturbations in refractive indices due to the grating 212 provide distributed optical feedback by means of Bragg scattering. By choosing the periodicity appropriately, typically by applying the Bragg condition, the device 200 provides distributed feedback at selected wavelengths. As such, a single-frequency laser may be achieved. However, the fabrication of DFB lasers has proven to be more costly and intricately more complex than the fabrication of lasers utilizing a Fabry-Perot configuration.

What is needed is a method and system for a single-frequency laser that is cost effective and easy to fabricate.

SUMMARY OF INVENTION

The present invention provides for a single-frequency laser for use in an optical communication system. The single-frequency laser includes a first cladding layer, a second cladding layer, an active layer and an approximately V-shaped thin-film interferometer filter. The active layer including a longitudinal axis is disposed between the first cladding layer and the second cladding layer. The thin-film interferometer filter extends through the active layer.

The present invention also provides for a single-frequency laser for use in an optical communication system. The single-frequency laser includes a first cladding layer, a second cladding layer, an active layer, an approximately V-shaped Fabry-Perot filter for transmitting and reflecting light and a regrowth region. The active layer includes a longitudinal axis and is disposed between the first cladding layer and the second cladding layer. The approximately V-shaped Fabry-Perot filter extends through the first cladding layer, the active layer and, at least partially, the second cladding layer, and is positioned approximately centrally in the laser. The regrowth region is positioned, at least in part, above the approximately V-shaped Fabry-Perot filter and adapted to guide transmitted light from the approximately V-shaped Fabry-Perot filter along an optical path substantially parallel to the longitudinal axis of the active layer.

The present invention provides for a laser having a first cladding layer, a second cladding layer, an active layer and a thin-film interferometer filter. The active layer including a longitudinal axis is disposed between the first cladding layer and the second cladding layer. The thin-film interferometer filter extends through the active layer.

The present invention further provides for a laser having a Fabry-Perot configuration which supports a plurality of optical modes. The laser includes a first cladding layer, a second cladding layer, an active layer and means for suppressing all, but one of the optical modes, of the plurality of optical modes. The active layer including a longitudinal axis is disposed between the first cladding layer and the second cladding layer. The suppressing means extend through the active layer.

The present invention provides for an optical communication system utilizing wavelength division multiplexing. The system includes an information input signal which is divided into a plurality of information signals, a plurality of single-frequency lasers, an optical waveguide, and a plurality of demultiplexers. Each information signal of the plurality of information signals is coupled to one single-frequency laser of the plurality of single-frequency lasers. Each single-frequency laser has a first cladding layer, a second cladding layer, an active layer disposed between the first cladding layer and the second cladding layer, and a thin-film interferometer filter extending through the active layer. The plurality of single-frequency lasers are coupled to the optical waveguide. The plurality of demultiplexers are coupled to the optical waveguide and are adapted to reconstruct the information input signal.

The present invention also provides for an optical communication system utilizing wavelength division multiplexing. The system includes a plurality of data transmission terminals, a plurality of single-frequency lasers, an optical waveguide, a plurality of demultiplexers and a plurality of reception terminals. Each data transmission terminal of the plurality of data transmission terminals is coupled to one single-frequency laser of the plurality of single-frequency lasers. Each single-frequency laser has a first cladding layer, a second cladding layer, an active layer disposed between the first cladding layer and the second cladding layer, and a thin-film interferometer filter extending through the active layer. The plurality of single-frequency lasers are coupled to the optical waveguide. The plurality of demultiplexers are coupled to the optical waveguide. Each demultiplexer of the plurality of demultiplexers is coupled to one reception terminal of the plurality of reception terminals.

The present invention provides for a process for making a single-frequency laser, the process including the steps of depositing a first cladding layer on a substrate, doping the first cladding layer, depositing an active layer on top of the first cladding layer, depositing a second cladding layer on the active layer, doping the second cladding layer oppositely from the doping of the first cladding layer, etching an approximately V-shaped groove through the active layer, and depositing a thin-film interferometer filter on top of the V-shaped groove.

The present invention provides for a method of suppressing all but one of the optical modes of a resonant cavity of a Fabry-Perot laser. The method extends a Fabry-Perot filter through the resonant cavity at an angle to a longitudinal axis of the resonant cavity, transmitting through the Fabry-Perot filter only one desired optical mode, and suppressing all optical modes besides the one desired optical mode.

DETAILED DESCRIPTION

In the field of optical communications, for example, single-wavelength lasers are highly coveted. Single wavelength lasers find application in Wavelength Division Multiplexing (WDM) in which information may be transmitted through an optical waveguide at a plurality of wavelengths simultaneously.

Figure 1:
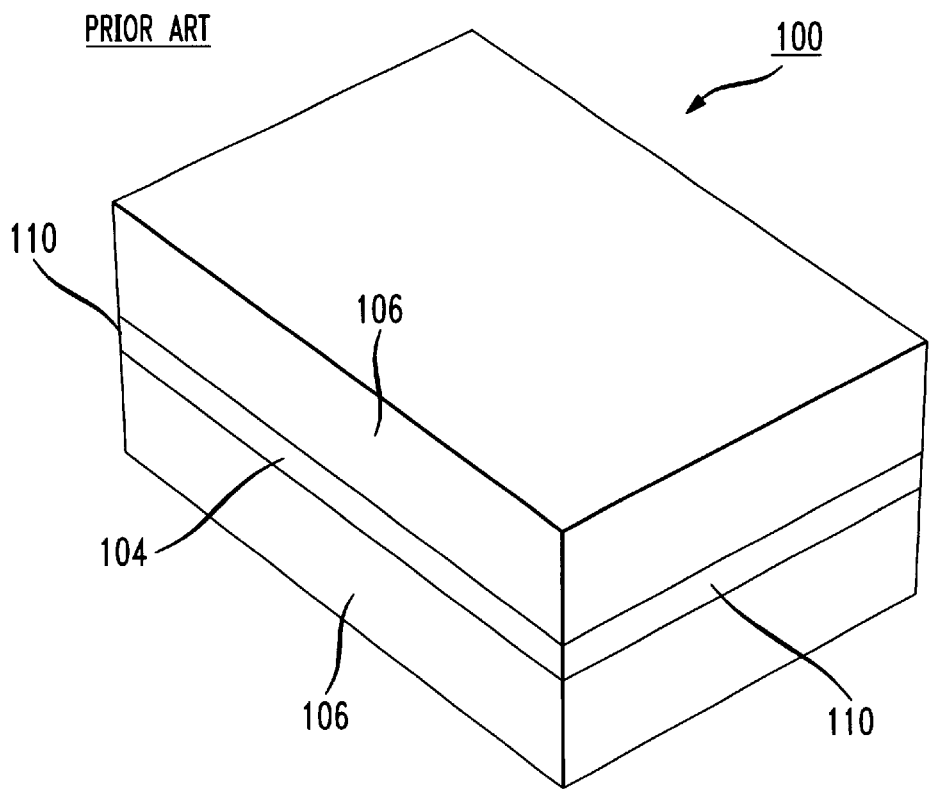
FIG. 1 illustrates a perspective view of a Fabry-Perot laser.
Figure 2:
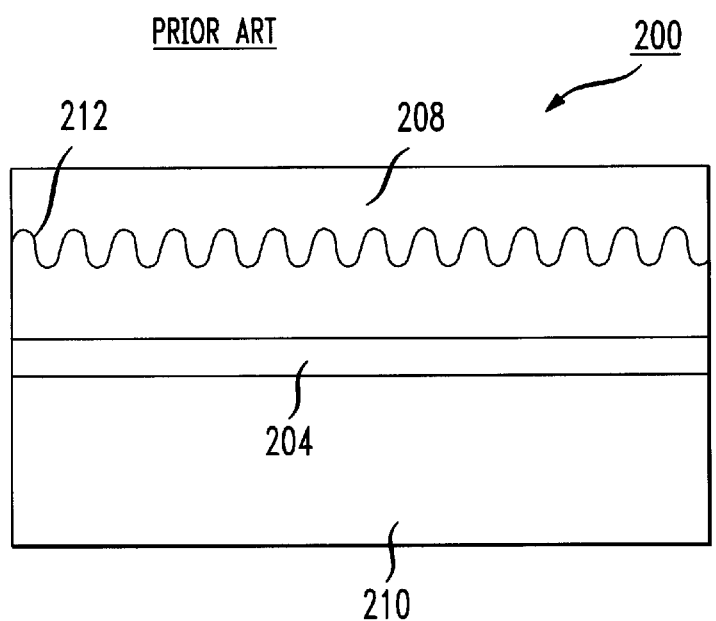
FIG. 2 illustrates a side view of a distributed feedback laser.
Figure 3:
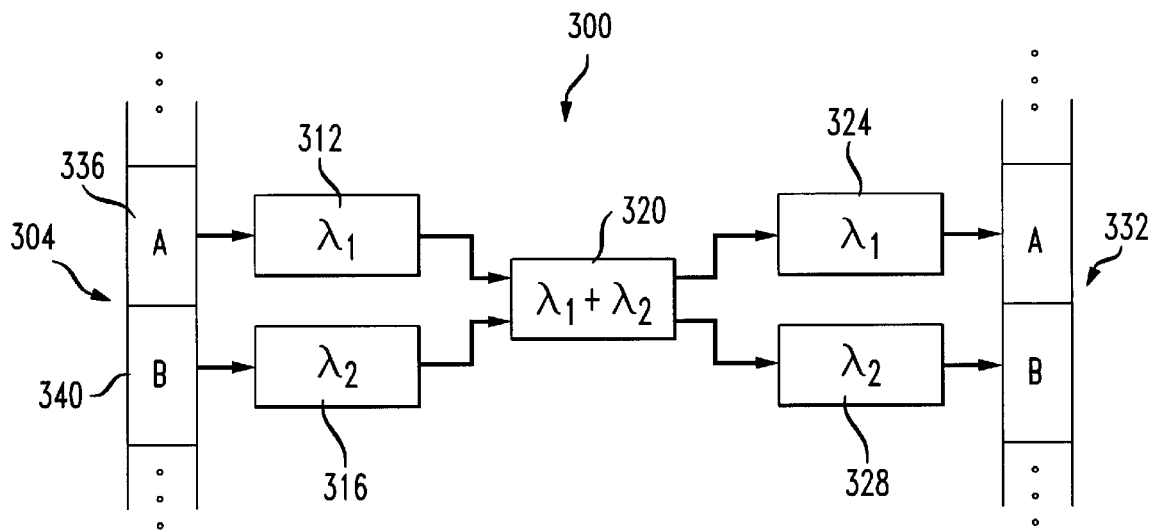
FIG. 3 is a schematic illustration of an example of an optical communication system according to the present invention.

FIG. 3 provides a schematic of a simplified optical communication system 300 using WDM. The system 300 comprises an information input signal 304, single-frequency lasers 312 and 316, an optical waveguide 320, demultiplexers 324 and 328, and an information output signal 332. In this embodiment, the information input signal 304 is coupled to the two single-frequency lasers 312 and 316. The two single-frequency lasers 312 and 316 are coupled to the optical waveguide 320. The optical waveguide 320 is coupled to the demultiplexers 324 and 328. Finally, the demultiplexers 324 and 328 are coupled to the information output signal 332.

In operation and use, the information input signal 304 is split into, for example, two information signals 336 and 340. The information signal 336 provides modulation for the single-frequency laser 312 which operates at a single wavelength of $\lambda_1$. The information signal 340 provides modulation for the single-frequency laser 316 which operates at a single wavelength of $\lambda_2$. The modulated signals from each single-frequency laser 312 and 316 are both guided into the optical waveguide 320. The optical waveguide 320 propagates both wavelengths of light $\lambda_1$ and $\lambda_2$. The combined signal exits the waveguide 320 into the demultiplexers 324 and 328. The demultiplexers 324 and 328 separate the combined signal according to wavelength and demodulate the separated signals. The two extracted information signals form the information output signal 332.

Figure 4:
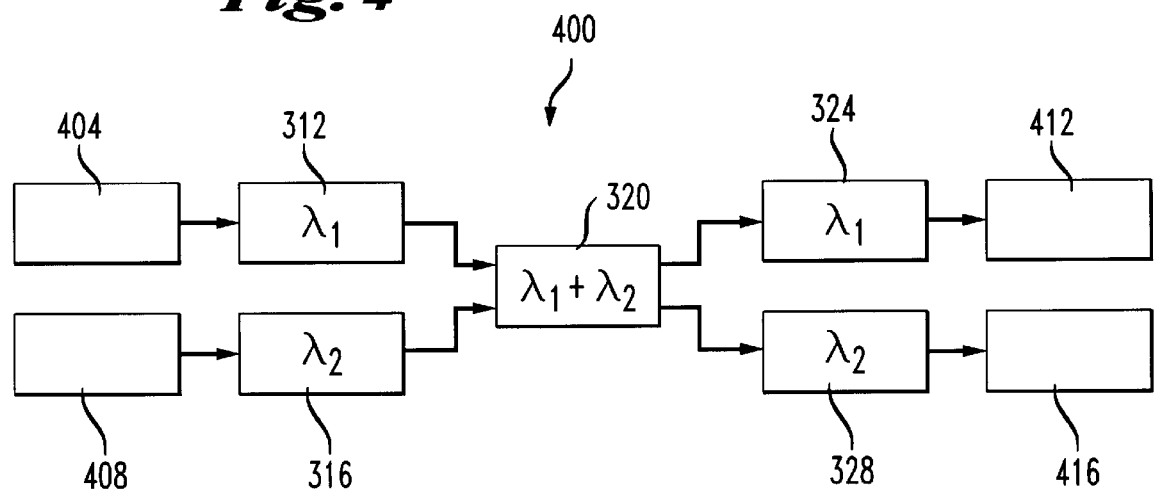
FIG. 4 is a schematic illustration of another example of the optical communication system according to the present invention.

FIG. 4 provides another example of a simplified optical communication system 400. The system 400 comprises two data transmission terminals 404 and 408, the single-frequency lasers 312 and 316, the optical waveguide 320, the demultiplexers 324 and 328 and two reception terminals 412 and 416. In this embodiment, which again is only illustrative, each data transmission terminal 404 or 408 is coupled to one single-frequency laser 312 or 316, respectively. The two single-frequency lasers 312 and 316 are coupled to the optical waveguide 320. The optical waveguide 320 is coupled to the demultiplexers 324 and 328. Finally, each demultiplexer 324 or 328 is coupled to one reception terminal 412 or 416, respectively.

In operation and use, each data transmission terminal 404 or 408 carries its own data in the form of an information signal. The signal from the data transmission terminal 404 is coupled to the single-frequency laser 312 such that the signal provides modulation for the single-frequency laser 312 which operates at the single wavelength of $\lambda_1$. The signal from the data transmission terminal 408 is coupled to the single-frequency laser 316 such that the signal provides modulation for the single-frequency laser 316 which operates at the single wavelength of $\lambda_2$. The modulated signals from each single-frequency laser 312 and 316 are guided into the optical waveguide 320. The combined signal exits the waveguide 320 into the demultiplexers 324 and 328. The demultiplexers 324 and 328 separate the combined signal according to wavelength and demodulate the separated signals before guiding each extracted information signal into one reception terminal 412 or 416.

Figure 5:
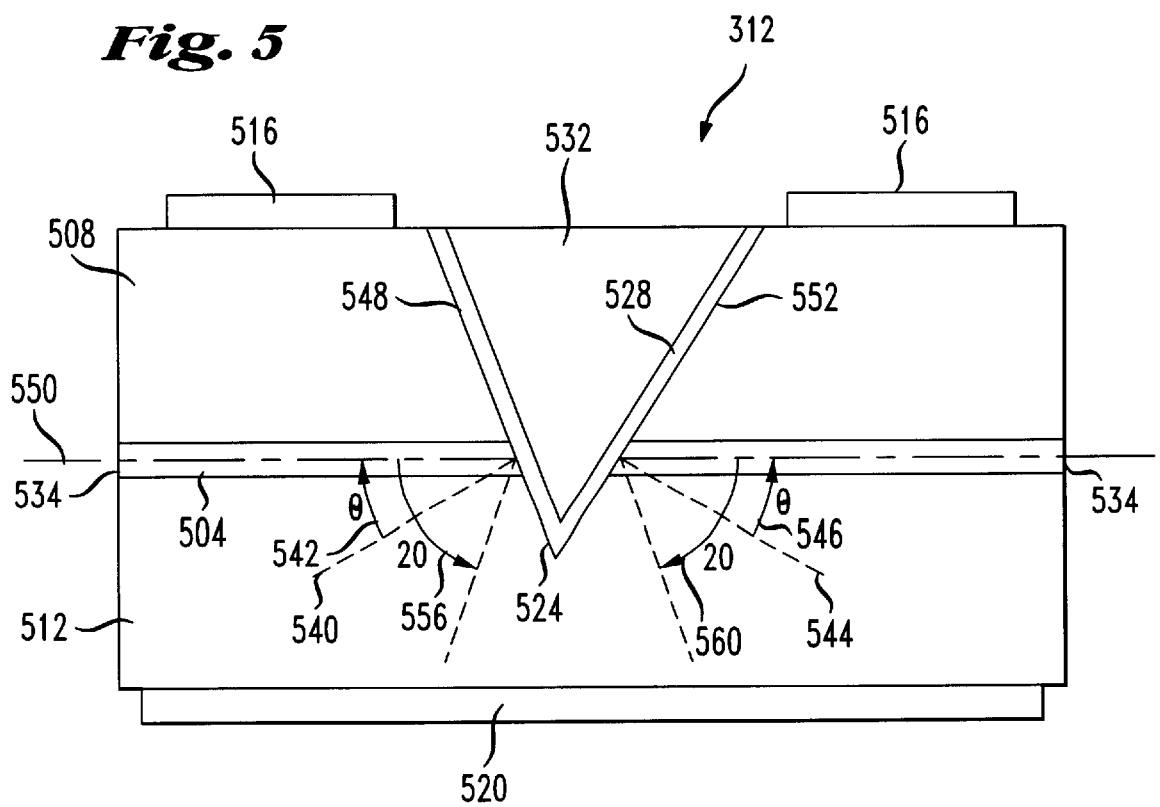
FIG. 5 illustrates a cross-sectional view of a Fabry-Perot configured laser with a thin-film interferometer filter according to the present invention.

FIG. 5 illustrates a cross-sectional view of a preferred embodiment for the single-frequency laser 312 or 316 using a Fabry-Perot configuration. The Fabry-Perot configuration is one of the simplest and least expensive lasers to fabricate. The laser 312 or 316 comprises an active layer 504, two cladding layers 508 and 512, two electrodes 516 and 520, an approximately V-shaped groove 524, a thin-film interferometer filter 528 and a regrowth region 532.

The active layer 504 is positioned between two cladding layers 508 and 512 and provides an optical resonant cavity for the laser 312 or 316. For general optical communication applications, the active layer 504 typically comprises InGaAsP and the cladding layers 508 and 512 typically comprise InP in which the two cladding layers are oppositely doped. Other semiconductors and compound semiconductors may be used in any number of combinations to fabricate a laser as is known by one skilled in the art. The layers 504, 508 and 512 are cleaved to create partially reflective mirrors 534.

The approximately V-shaped groove 524 extends through the cladding layer 508, the active layer 504 and, at least partially, through the cladding layer 512. In other preferred embodiments, the approximately V-shaped groove 524 extends through the active layer 504 and, at most, extends only partially through one of the cladding layers 508 and 512. The present invention contemplates the approximately V-shaped groove 524 extending through both of the cladding layers 508 and 512, through either of the cladding layers 508 and 512, or through neither of the cladding layers 508 and 512. In FIG. 5, the V-shaped groove 524 is approximately centrally positioned in the laser 312 or 316. In another preferred embodiment, the V-shaped groove 524 is not approximately, centrally positioned in the laser 312 or 316. The thin-film interferometer filter 528 forms an approximately V-shape on top of the approximately V-shaped groove 524. In other preferred embodiments, the thin-film interferometer filter 528 takes on different geometries and shapes.

In the cross-sectional view illustrated in FIG. 5, the filter 528 is positioned in relation to the active layer 504 such that a line 540, normal to a side 548 of the approximately V-shaped, thin-film interferometer filter 528, forms an angle 542 of magnitude θ with a longitudinal axis 550 of the active layer 504. In addition, a line 544, normal to a side 552 of the approximately V-shaped, thin-film interferometer filter 528, forms an angle 546 of magnitude θ with the longitudinal axis 550 of the active layer 504. In a preferred embodiment, the magnitude θ is approximately between about 0 degrees and about 90 degrees.

The regrowth region 532 is positioned, at least in part, on top of the thin-film interferometer filter 528 and fills up the rest of the approximately V-shaped groove 524. The regrowth region 532 comprises dielectric material having an effective refractive index characterized in that light of the desired wavelength of the single-frequency laser 312 or 316 is guided in a direction substantially parallel with the longitudinal axis 550. In another preferred embodiment, the regrowth region 532 comprises structure and material adapted to focus the light of the desired wavelength of the single-frequency laser 312 or 316 into the active layer 504 along an optical path substantially parallel with the longitudinal axis 550.

Electrode 516 is positioned on top of cladding layer 508. Electrode 520 is positioned below cladding layer 512. In one preferred embodiment, electrode 516 is divided or partially divided on either side of the V-shaped groove 524. The electrodes 516 and 520 typically comprise a metal, alloy or highly doped semiconductor or compound semiconductor as is known in the art.

Figure 6:
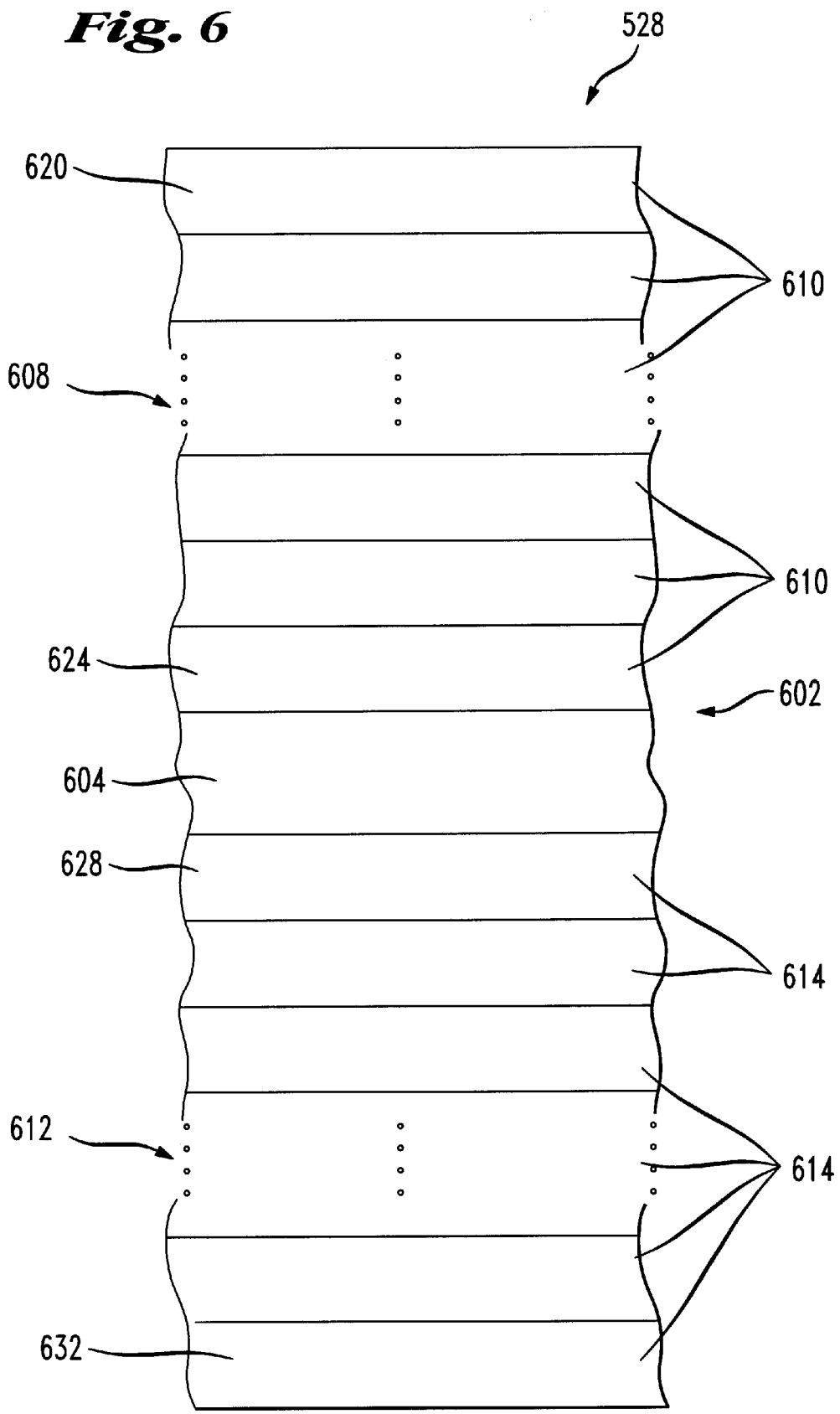
FIG. 6 illustrates an example of a Fabry-Perot interferometer filter according to the present invention.

In a preferred embodiment, the thin-film interferometer filter 528 comprises a stack 602 of dielectric layers as shown in FIG. 6. FIG. 6 illustrates a preferred embodiment of the thinfilm interferometer filter 528 in the configuration of a Fabry-Perot filter. The Fabry-Perot filter comprises a spacer 604 with a half-wave optical thickness and two sets of quarter-wave stacks 608 and 612. The spacer 604 is positioned between the quarter-wave stacks 608 and 612.

In a preferred embodiment, the quarter-wave stacks 608 and 612 are approximately identical to each other as seen from the spacer 604. As is well known in the art, layers 610 or 614 in each quarter-wave stack 608 or 612, respectively, alternate layer to layer between a high index of refraction to a low index of refraction. In another preferred embodiment, in order to increase the reflectance of each quarter-wave stack 608 or 612, inter alia, a high-index material is provided as a top layer 620 of stack 608 and as a bottom layer 632 of stack 612. In yet another preferred embodiment, the effective reflectance of each stack 608 or 612 is made higher by increasing the number of layers 610 or 614 within each stack 608 or 612, respectively.

In one preferred embodiment, the Fabry-Perot filter comprises a top layer 628 of stack 612 having a high-index material, the spacer 604 having a low-index material and a bottom layer 624 of stack 608 having a high-index material. In another preferred embodiment, the Fabry-Perot filter comprises the top layer of 628 stack 612 having a low-index material, the spacer 604 having a high-index material and the bottom layer 624 of stack 608 having a low-index material.

In operation and use, referring back to FIG. 5, a current or voltage is applied to the electrodes 516. The injection current causes the laser 312 or 316 to be forward biased as determined by the doping of the cladding layers 508 and 512. In a simplified explanation, which is not meant to limit the present invention, a forward biased laser will lase and a reversed biased laser will not lase. In such a manner, the modulation of the injection current or voltage can modulate the light exiting the laser 312 or 316.

Upon reaching a threshold current or voltage level, as is well known in the art, the laser 312 or 316 begins to lase at a number of different modal wavelengths as determined, in part, by the geometries of the Fabry-Perot configuration. The different wavelengths which are amplified in the active layer 504 are reflected by the cleaved facets 534 of the active layer 504. The light composed of different modal wavelengths impinges upon either side 548 or 552 of the thin-film interferometer filter 528 at the angle 542 or 546 of magnitude θ made with the normal 540 or 544 of each side 548 or 552, respectively. In a preferred embodiment, multiple-beam interference in the spacer layer 604 causes the transmission of the filter 528 to be extremely high over a narrow band of wavelengths around that for which the spacer 604 is a multiple of one half wavelength thick. The transmitted light which enters the regrowth region 532 is guided by the regrowth region 532 such that optical propagation of the desired wavelength is in a direction substantially parallel to the longitudinal axis 550.

In a preferred embodiment, the Fabry-Perot filter may be designed by changing, for example, the thickness of the spacer 604 or the slope of the sides 548 and 552 of the approximately V-shaped, thin-film interferometer filter 528, to allow only the desired mode of the laser 312 or 316 to be transmitted through the Fabry-Perot filter. In one preferred embodiment, the desired mode would have a wavelength approximately equal to the first order wavelength λ where:

$$\lambda = 2nd\cos\theta,$$

n is the effective refractive index of the spacer 604,
d is the thickness of the spacer 604, and
θ is the angle as defined above.

Those wavelengths not near the wavelength λ are reflected at an angle 556 or 560 of magnitude 2θ from the longitudinal axis 550. In a preferred embodiment, those wavelengths not near the wavelength λ are reflected at an angle 556 or 560 of magnitude 2θ from the longitudinal axis 550 into the cladding layer 512 where they are absorbed or significantly dampened. In such a manner, the laser modes having lengths not near the wavelength λ are suppressed. The output of the laser 312 or 316, if designed appropriately, is of a single wavelength which is approximately equal to the wavelength λ.

The fabrication of the single-frequency laser 312 or 316 illustrated in FIG. 5 will now be described. The cladding layer 512, preferably comprising InP, is grown with a designed doping level on an appropriate substrate. The active layer 504, preferably comprising InGaAsP, is grown on top of the cladding layer 512. The cladding layer 508, preferably comprising InP, is grown with a designed doping level on the active layer 504. The doping of cladding layer 508 should be of the opposite kind of the doping of cladding layer 512. Any number of growth and is deposition techniques, well known in the art, may be employed such as, but not limited to, liquid-phase epitaxy, metal-organic vapor-phase epitaxy (MOVPE), metal-organic chemical vapor deposition (MOCVD), organometallic vapor-phase epitaxy (OMVPE), or molecular-beam epitaxy (MBE).

The approximately V-shaped groove 524 is etched through the cladding layer 508, the active layer 504 and, at least partially, the cladding layer 512. As one design variable, the slope of the sides of the approximately V-shaped groove 524 are determined by the choice of etchants and the choice of material used to fabricate the laser 312 or 316. The thin-film interferometer filter 528 is grown taking on the approximately V-shape of the groove 524. In a preferred embodiment, the Fabry-Perot filter is grown on the approximately V-shaped groove 524. Techniques for fabricating Fabry-Perot filters and the choice of high- and low-index materials are well known in the art and are not described here. As a further note, however, the desired wavelength of the laser 312 or 316 is determined, in great part, by the choice of materials and by the thickness of the layers 610 and 614 of the stacks 608 and 612, respectively, and the thickness of the spacer 604. The regrowth region 532 is grown, at least in part, on top of the filter 528.

Using conventional masking techniques, the electrode 516 is grown on top of cladding layer 508. In a preferred embodiment, the electrode 516 is grown on the cladding layer 508 on either side of the regrowth region 532. The electrode 520 is grown on the bottom of cladding layer 512 or under the substrate on which the cladding layer 520 is grown. The electrodes 516 and 520 may comprise a metal, alloy, or a highly-doped semiconductor or compound semiconductor. Methods for depositing electrodes are well known in the art and are not described here.

In the foregoing description, the method and apparatus of the present invention have been described with reference to specific preferred embodiments. It is to be understood and expected that variations in the principles of the method and apparatus herein disclosed may be made by one skilled in the art and it is intended that such modifications, changes, and substitutions are to be included within the scope of the present invention as set forth in the appended claims. The specification and the drawings are accordingly to be regarded in an illustrative rather than in a restrictive sense.

What is claimed is:

1. A single-frequency laser for use in an optical communication system, said single-frequency laser, comprising:
    a first cladding layer;
    a second cladding layer;
    an active layer including a longitudinal axis, said active layer disposed between said first cladding layer and said second cladding layer;
    an approximately V-shaped Fabry-Perot filter for transmitting and reflecting light, said approximately V-shaped Fabry-Perot filter extending through said first cladding layer, said active layer and, at least partially, said second cladding layer, said approximately V-shaped Fabry-Perot filter positioned approximately centrally in the laser; and
    a regrowth region, said regrowth region positioned, at least in part, above said approximately V-shaped Fabry-Perot filter and adapted to guide transmitted light from the approximately V-shaped Fabry-Perot filter along an optical path substantially parallel to the longitudinal axis of said active layer.

2. A single-frequency laser for use in an optical communication system, said single-frequency laser, comprising:
    a first cladding layer;
    a second cladding layer;
    an active layer including a longitudinal axis, said active layer disposed between said first cladding layer and said second cladding layer; and
    an approximately V-shaped thin-film interferometer filter, said thin-film interferometer filter extending through said active layer, and wherein said thin-film interferometer filter forms an acute angle with said longitudinal axis.

3. The single-frequency laser of claim 2, wherein said approximately V-shaped thin-film interferometer filter is a Fabry-Perot filter.

4. The single-frequency laser of claim 3, wherein said Fabry-Perot filter comprises:
    a first quarter-wave stack having a top and a bottom layer;
    a half-wave spacer positioned underneath the bottom layer of said first quarter-wave stack; and
    a second quarter-wave stack having a top and a bottom layer, the top layer of said second quarter-wave stack positioned underneath said half-wave spacer.

5. The single-frequency laser of claim 2, wherein said active layer comprises InGaAsP.

6. The single-frequency laser of claim 2, wherein said laser is a single-frequency laser.

7. The single-frequency laser of claim 2, further comprising:
    a regrowth region positioned, at least in part, on top of said thin-film interferometer filter, said regrowth region having an effective index of refraction such that light transmitted through said thin-film interferometer filter and into said regrowth region has an optical propagation substantially parallel to the longitudinal axis.

8. A single-frequency laser for use in an optical communication system, said single-frequency laser, comprising:
    a first cladding layer;
    a second cladding layer;
    an active layer including a longitudinal axis, said active layer disposed between said first cladding layer and said second cladding layer; and
    an approximately V-shaped thin-film interferometer filter, said thin-film interferometer filter extending through said active layer, wherein said approximately V-shaped thin-film interferometer filter is a Fabry-Perot filter, and wherein said Fabry-Perot filter comprises:
    a first quarter-wave stack having a top and a bottom layer;
    a half-wave spacer positioned underneath the bottom layer of said first quarter-wave stack; and
    a second quarter-wave stack having a top and a bottom layer, the top layer of said second quarter-wave stack positioned underneath said half-wave spacer.

9. The single-frequency laser of claim 8, wherein the top layer of said first quarter-wave stack comprises a high-index dielectric material and wherein the bottom layer of said second quarter-wave stack comprises the high-index dielectric material.

10. The single-frequency laser of claim 8, wherein the top layer of said second quarter-wave stack comprises a high-index dielectric material, the half-wave spacer comprises a low-index dielectric material, and the bottom layer of said first quarter-wave stack comprises the high-index dielectric material.

11. The single-frequency laser of claim 8, wherein the top layer of said second quarter-wave stack comprises a low-index dielectric material, the half-wave spacer comprises a high-index dielectric material, and the bottom layer of said first quarter-wave stack comprises the low-index dielectric material.

12. The single-frequency laser of claim 8, wherein the top layer of said first quarter-wave stack comprises a high-index dielectric material and wherein the bottom layer of said second quarter-wave stack comprises a high-index dielectric material.

13. The single-frequency laser of claim 8, wherein the top layer of said second quarter-wave stack comprises a high-index dielectric material, the half-wave spacer comprises a low-index dielectric material, and the bottom layer of said first quarter-wave stack comprises a high-index dielectric material.

14. The single-frequency laser of claim 8, wherein the top layer of said second quarter-wave stack comprises a low-index dielectric material, the half-wave spacer comprises a high-index dielectric material, and the bottom layer of said first quarter-wave stack comprises a low-index dielectric material.

15. A laser, comprising:
a first cladding layer;
a second cladding layer;
an active layer including a longitudinal axis, said active layer disposed between said first cladding layer and said second cladding layer; and
a thin-film interferometer filter, said thin-film interferometer filter extending through said active layer, and wherein said thin-film interferometer filter forms an acute angle with said longitudinal axis.

16. The laser of claim 15, wherein said thin-film interferometer filter is approximately V-shaped.

17. The laser of claim 15, wherein said active layer comprises InGaAsP.

18. The laser of claim 15, further comprising:
a regrowth region positioned, at least in part, on top of said thin-film interferometer filter, said regrowth region having an effective index of refraction such that light transmitted through said thin-film interferometer filter and into said regrowth region has an optical propagation substantially parallel to the longitudinal axis.

19. The laser of claim 15, further comprising:
means for guiding light transmitted through said thin-film interferometer filter on an optical path that is substantially parallel to the longitudinal axis, said means positioned above said thin-film interferometer filter.

20. The laser of claim 15, wherein said thin-film interferometer filter is a Fabry-Perot filter, said Fabry-Perot filter comprising a first quarter-wave stack having a top and a bottom layer, a half-wave spacer positioned underneath the bottom layer of said first quarter-wave stack, and a second quarter-wave stack having a top and a bottom layer, the top layer of said second quarter-wave stack positioned underneath said half-wave spacer.

21. A laser, comprising:
a first cladding layer;
a second cladding layer;
an active layer including a longitudinal axis, said active layer disposed between said first cladding layer and said second cladding layer; and
a thin-film interferometer filter, said thin-film interferometer filter extending through said active layer;
wherein said thin-film interferometer filter is a Fabry-Perot filter, said Fabry-Perot filter comprising a first quarter-wave stack having a top and a bottom layer, a half-wave spacer positioned underneath the bottom layer of said first quarter-wave stack, and a second quarter-wave stack having a top and a bottom layer, the top layer of said second quarter-wave stack positioned underneath said half-wave spacer.

22. The laser of claim 21, wherein the top layer of said first quarter-wave stack comprises a high-index dielectric material and wherein the bottom layer of said second quarter-wave stack comprises the high-index dielectric material.

23. The laser of claim 21, wherein the top layer of said second quarter-wave stack comprises a high-index dielectric material, the half-wave spacer comprises a low-index dielectric material, and the bottom layer of said first quarter-wave stack comprises the high-index dielectric material.

24. The laser of claim 21, wherein the top layer of said second quarter-wave stack comprises a low-index dielectric material, the half-wave spacer comprises a high-index dielectric material, and the bottom layer of said first quarter-wave stack comprises the low-index dielectric material.

25. The laser of claim 21, wherein the top layer of said first quarter-wave stack comprises a high-index dielectric material and wherein the bottom layer of said second quarter-wave stack comprises a high-index dielectric material.

26. The laser of claim 21, wherein the top layer of said second quarter-wave stack comprises a high-index dielectric material, the half-wave spacer comprises a low-index dielectric material, and the bottom layer of said first quarter-wave stack comprises a high-index dielectric material.

27. The laser of claim 21, wherein the top layer of said second quarter-wave stack comprises a low-index dielectric material, the half-wave spacer comprises a high-index dielectric material, and the bottom layer of said first quarter-wave stack comprises a low-index dielectric material.

28. A laser having a Fabry-Perot configuration which supports a plurality of optical modes, comprising:
a first cladding layer;
a second cladding layer;
an active layer, said active layer disposed between said first cladding layer and said second cladding layer; and
means for suppressing all but one of the optical modes, of said plurality of optical modes, said means extending through said active layer, and wherein said means for suppressing all but one of the optical modes forms an acute angle with said active layer.

29. An optical communication system utilizing wavelength division multiplexing, comprising:
an information input signal, said information input signal divided into a plurality of information signals;
a plurality of single-frequency lasers, each information signal of said plurality of information signals coupled to one single-frequency laser of said plurality of single-frequency lasers, each single-frequency laser having a first cladding layer, a second cladding layer, an active layer disposed between said first cladding layer and said second cladding layer, and a thin-film interferometer filter extending through said active layer, and wherein said thin-film interferometer filter forms an acute angle with said active layer;
an optical waveguide, said plurality of single-frequency lasers coupled to said optical waveguide; and
a plurality of demultiplexers coupled to said optical waveguide and adapted to reconstruct said information input signal.

30. An optical communication system utilizing wavelength division multiplexing, comprising:

a plurality of data transmission terminals;

a plurality of single-frequency lasers, each data transmission terminal of said plurality of data transmission terminals coupled to one single-frequency laser of said plurality of single-frequency lasers, each single-frequency laser having a first cladding layer, a second cladding layer, an active layer disposed between said first cladding layer and said second cladding layer, and a thin-film interferometer filter extending through said active layer, and wherein said thin-film interferometer filter forms an acute angle with said active layer;

an optical waveguide, said plurality of single-frequency lasers coupled to said optical waveguide;

a plurality of demultiplexers coupled to said optical waveguide; and a plurality of reception terminals, each demultiplexer of said plurality of demultiplexers being coupled to one reception terminal of said plurality of reception terminals.

\* \* \* \* \*